(12) United States Patent
Palaszewski

(10) Patent No.: US 7,714,731 B2
(45) Date of Patent: May 11, 2010

(54) DETECTION OF AIR FILTER CLOGGING AND PROVISION OF EMERGENCY VENTILATION IN AN OUTDOOR ELECTRONICS CABINET COOLED BY AMBIENT FORCED AIR

(75) Inventor: Stephen Palaszewski, Chester, NJ (US)

(73) Assignee: Andrew LLC, Hickory, NC (US)

( * ) Notice: Subject to any disclaimer, the term of this patent is extended or adjusted under 35 U.S.C. 154(b) by 309 days.

(21) Appl. No.: 11/766,995

(22) Filed: Jun. 22, 2007

(65) Prior Publication Data

US 2008/0316038 A1  Dec. 25, 2008

(51) Int. Cl.
*G08B 17/00* (2006.01)
(52) U.S. Cl. ............... 340/584; 340/588; 340/589; 340/581; 340/577; 340/643; 340/870.17; 236/49.2; 236/49.3
(58) Field of Classification Search ............... 340/584, 340/588, 581, 628, 643, 693.5, 870.17, 589, 340/577; 236/49.1, 49.2, 49.3, 94
See application file for complete search history.

(56) References Cited

U.S. PATENT DOCUMENTS

| | | | |
|---|---|---|---|
| 2,167,472 A | 7/1939 | Bedford | |
| 2,488,518 A | 11/1949 | Zucker | |
| 4,126,629 A | 11/1978 | Cragoe et al. | |
| 4,251,026 A | 2/1981 | Siegel et al. | |
| 4,352,349 A | 10/1982 | Yoho | |
| 4,443,524 A | 4/1984 | Meinhold et al. | |
| 4,659,290 A | 4/1987 | Kundert | |
| 4,667,480 A | 5/1987 | Bessler | |
| 4,722,669 A | 2/1988 | Kundert | |
| 4,756,473 A | 7/1988 | Takemae et al. | |
| 4,949,218 A | 8/1990 | Blanchard et al. | |
| 5,102,040 A | 4/1992 | Harvey | |
| 5,119,884 A | 6/1992 | DeBoer | |
| 5,150,277 A | 9/1992 | Bainbridge et al. | |
| 5,469,328 A | 11/1995 | Palaszewski | |
| 5,484,012 A | 1/1996 | Hiratsuka | |
| 5,544,697 A | 8/1996 | Clark | |
| 5,570,740 A | 11/1996 | Flores et al. | |
| 5,585,205 A | 12/1996 | Kohchi | |
| 5,626,288 A | 5/1997 | Huber | |
| 5,688,169 A | 11/1997 | Duong et al. | |
| 5,697,840 A | 12/1997 | Bainbridge et al. | |
| 5,844,208 A | 12/1998 | Tustaniwskyj et al. | |
| 5,860,291 A | 1/1999 | Johnson et al. | |
| 6,000,464 A | 12/1999 | Scafidi et al. | |
| 6,064,310 A * | 5/2000 | Busak et al. | 340/588 |
| 6,072,397 A * | 6/2000 | Ostrowski | 340/588 |
| 6,123,266 A | 9/2000 | Bainbridge et al. | |

(Continued)

*Primary Examiner*—Hung T. Nguyen
(74) *Attorney, Agent, or Firm*—Wood, Herron & Evans, LLP

(57) ABSTRACT

A detection mechanism for monitoring airflow in an electronics enclosure includes a first thermal sensor positioned proximate the enclosure for measuring an ambient air temperature and a second thermal sensor positioned proximate an exit air stream for measuring the temperature of air that is heated by the electronics in the enclosure. A control circuit is coupled with the first and second thermal sensors and is configured for determining a temperature differential between the measured temperatures of the thermal sensors. The control circuit may initiate an alarm when the temperature differential exceeds a setpoint thereby indicating restricted airflow in the enclosure. The control circuit might also take other remedial steps prior to initiating the alarm.

32 Claims, 2 Drawing Sheets

U.S. PATENT DOCUMENTS

| | | |
|---|---|---|
| 6,127,663 A | 10/2000 | Jones |
| 6,209,631 B1 | 4/2001 | Garcia-Ortiz |
| 6,317,320 B1 | 11/2001 | Cosley et al. |
| 6,397,930 B1 | 6/2002 | Sterner |
| 6,435,267 B1 | 8/2002 | Sterner |
| 6,474,409 B1 | 11/2002 | Sterner |
| 6,535,382 B2 | 3/2003 | Bishop et al. |
| 6,554,697 B1 | 4/2003 | Koplin |
| 6,647,320 B1 | 11/2003 | Inoue |
| 6,684,944 B1 | 2/2004 | Byrnes et al. |
| 6,695,046 B1 | 2/2004 | Byrnes et al. |
| 6,742,583 B2 | 6/2004 | Tikka |
| 6,772,604 B2 | 8/2004 | Bash et al. |
| 6,886,353 B2 | 5/2005 | Patel et al. |
| 6,891,347 B2 | 5/2005 | Dobbs et al. |
| 6,945,058 B2 | 9/2005 | Bash et al. |
| 6,951,988 B2 | 10/2005 | Falcou et al. |
| 6,954,684 B2 | 10/2005 | Frankel et al. |
| 6,955,303 B2 | 10/2005 | Elm et al. |
| 7,003,377 B2 | 2/2006 | Chang et al. |
| 7,011,143 B2 | 3/2006 | Corrado et al. |
| 7,028,753 B2 | 4/2006 | Sterner |
| 7,051,802 B2 | 5/2006 | Baer |
| 7,069,976 B2 | 7/2006 | Lindgren |
| 7,100,385 B2 | 9/2006 | Craft, Jr. et al. |
| 7,112,131 B2 | 9/2006 | Rasmussen et al. |
| 7,116,238 B2 | 10/2006 | Nishimura et al. |
| 7,156,316 B2 | 1/2007 | Kates |
| 7,163,156 B2 | 1/2007 | Kates |
| 7,165,412 B1 | 1/2007 | Bean, Jr. |
| 7,168,627 B2 | 1/2007 | Kates |
| 7,184,268 B2 | 2/2007 | Espinoza-Ibarra et al. |
| 2006/0165149 A1* | 7/2006 | Kolk .......................... 374/1 |

\* cited by examiner

DETECTION OF AIR FILTER CLOGGING AND PROVISION OF EMERGENCY VENTILATION IN AN OUTDOOR ELECTRONICS CABINET COOLED BY AMBIENT FORCED AIR

FIELD OF THE INVENTION

This invention generally relates to enclosures for housing electronics components, and particularly, to enclosures that are ventilated for the dissipation of heat generated by the electronic components.

BACKGROUND OF THE INVENTION

Electronics enclosures, such as cabinets, are utilized for storing, housing, and protecting various electronics, such as those utilized for wireless or cellular communications. For example, pressurized outdoor electronic cabinets are often utilized to house electronic modules, such as multi-carrier power amplifiers (MCPA's) that generate significant amounts of heat. For cooling the electronics, the cabinets, or other enclosures, are ventilated such that ambient air is drawn into the cabinet and through the interior space of the cabinet to circulate around the electronic components, before being exhausted to the outside of the cabinet. To that end, generally, such cabinets utilize one or more inlet or intake openings that are in communication with air intake devices, such as fans. When the fans are activated or ON, outside ambient air is drawn through the inlet openings into the interior space of the cabinet. Presumably, the interior space is at a higher temperature than the ambient air temperature due to the heat generated by the electronic components contained therein. The ambient air circulates, and cools the components, and, in the process, the circulating air is heated. The heated air is then exhausted through outlet openings or exit openings formed in the cabinet, generally on the side of the cabinet opposite to the inlet openings.

Such openings are usually formed by multiple slits or perforations in the cabinet walls. Screens, or air filters, might be utilized in conjunction with the openings. During use, the openings, or the air filters associated therewith, might become clogged, such as from particulate debris in the circulating air or from large obstructions, such a sheet of paper being drawn up against the inlet openings. With the blocked or restricted forced airflow through the pressurized electronic cabinet, the electronic modules, or components therein, such as amplifiers, may overheat. Oftentimes, such electronic modules are equipped with their own detector to detect overheating, and the modules will shut down to prevent damage to the electronics. However, as may be appreciated, such a shut down of the electronics results in the loss of service to the wireless customers, such as cell phone subscribers. Therefore, it is desirable to detect the condition of the airflow within the electronics cabinet and the conditions of the inlet and outlet openings, and overall performance of the ventilation system.

To that end, some existing methods detect a clogged condition by detecting the speed of the air that exits the filters at the outlet openings in the cabinet. A reduction in the air speed of the exiting air would indicate a clogged filter at the input. However, such air speed sensors only detect localized airflow, and, therefore, are susceptible to issuing false alarms. For example, clogging of the air filter in the immediate vicinity of a sensor can result in a local reduction in the airflow. However, the remainder of the filter might be unrestricted. Or other filters may be unclogged and operating properly. Thus, any alarm condition would be unnecessary.

In other systems, high temperature alarms, provided by sensors within a cabinet, may be used to signal a possible reduction in airflow through the cabinet. However, in practice, the alarm points for such high temperature alarms are often set so low that false alarms are issued. Alternatively, the alarm point might be set so high that the equipment shutdown can occur before an alarm is actually issued. Both such conditions are undesirable.

Furthermore, a temperature detector only detects the overheating of an electronics module. It does not provide any indication of the reason for such overheating. For example, if the ambient temperature around the cabinet is high, and the inlet openings and filters become clogged, a high temperature cabinet alarm may issue. There is no indication that restricted airflow through the cabinet is a problem, nor is there any indication provided of an impending module overheating.

In some cabinets, a fan failure alarm might be provided when a fan shuts down. However, such fan failure alarms are often logically OR'd with a high temperature cabinet alarm. Therefore, a high temperature condition might be falsely indicated in the cabinet if a fan fails while the ambient temperature is high.

Accordingly, it is desirable to maintain the ventilation within an electronics cabinet or enclosure to prevent the unnecessary shutdown of the modules therein. Furthermore, it is desirable to provide an operator with an indication of flow-through conditions in the ventilation system of a cabinet without undue false alarms. It is further desirable to rectify a clogged intake condition before issuing an alarm, and to still adequately cool the electronic components when a blocked condition exists.

DETAILED DESCRIPTION OF THE INVENTION

The present invention addresses various of the issues noted above, and other drawbacks of the prior art by providing a ventilation system that utilizes a detection mechanism for monitoring airflow in an enclosure that has an interior space cooled with forced ambient air. A first thermal sensor measures ambient air temperature, and the second thermal sensor measures the temperature of heated air that is exiting the electronics in the cabinet that are to be cooled. For example, if amplifiers, such as MCPA's, are to be cooled, the second sensor is located in the exit air stream of the MCPA's. A control circuit receives outputs from each sensor, and determines the temperature differential between the measured temperatures. When the temperature differential exceeds a set point, thus indicating restricted airflow in the enclosure, an alarm is initiated. Various other steps might be taken prior to initiating an alarm to address the blocked condition. Furthermore, the present invention provides cooling even during a blocked condition.

Figure 1A:
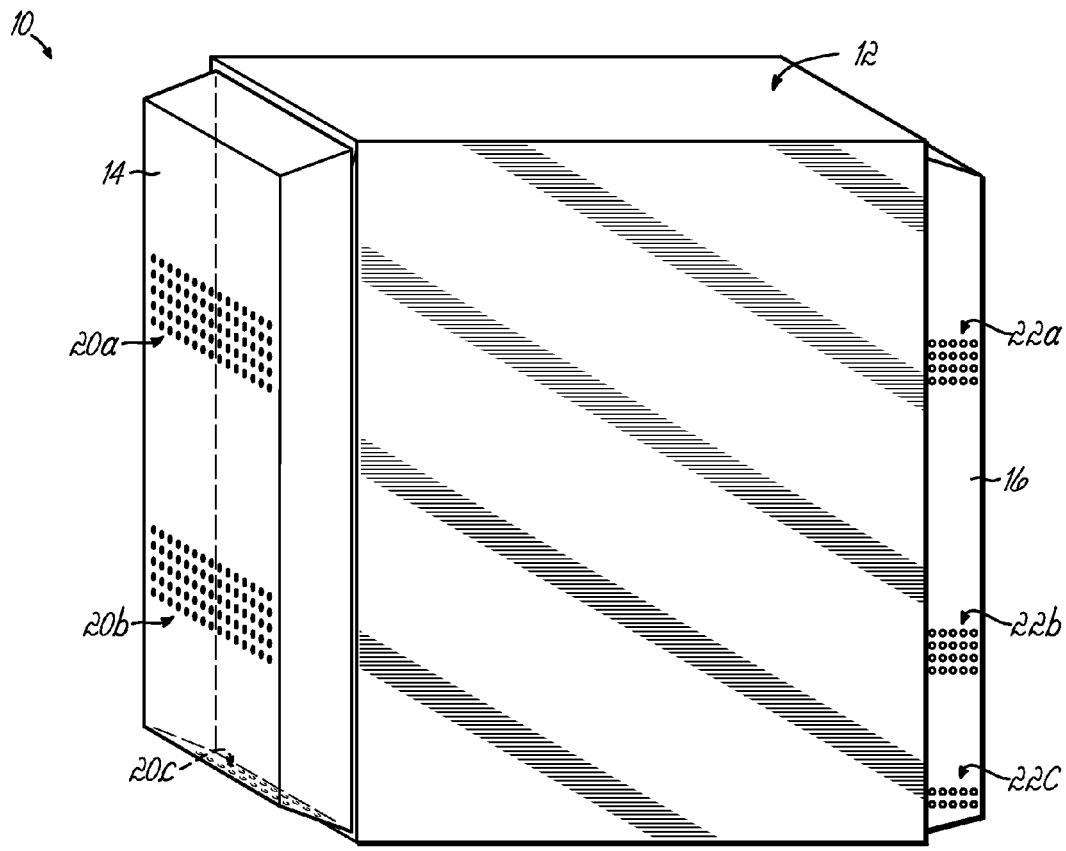
FIG. 1A illustrates a side view of an enclosure for housing electronics having inlet openings and outlet openings.
Figure 1B:
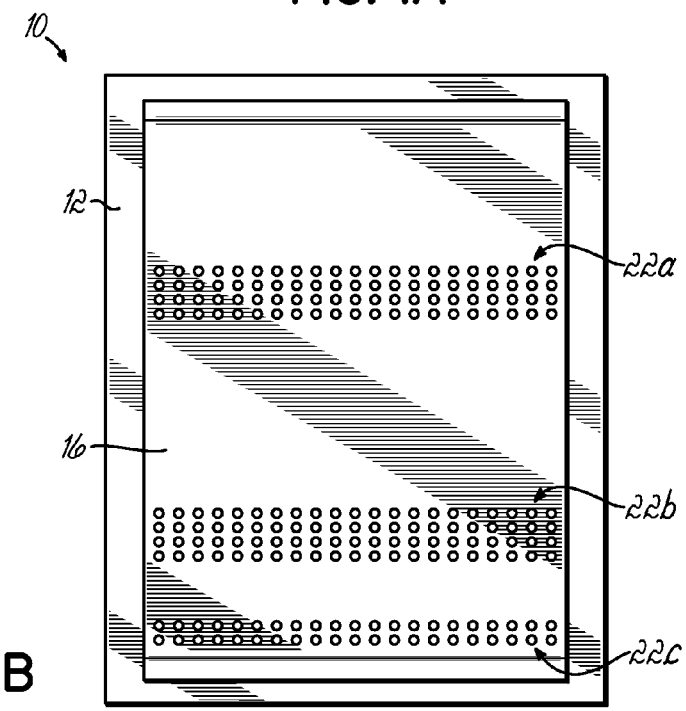
FIG. 1B is a rear view of the enclosure of FIG. 1A.
Figure 2:
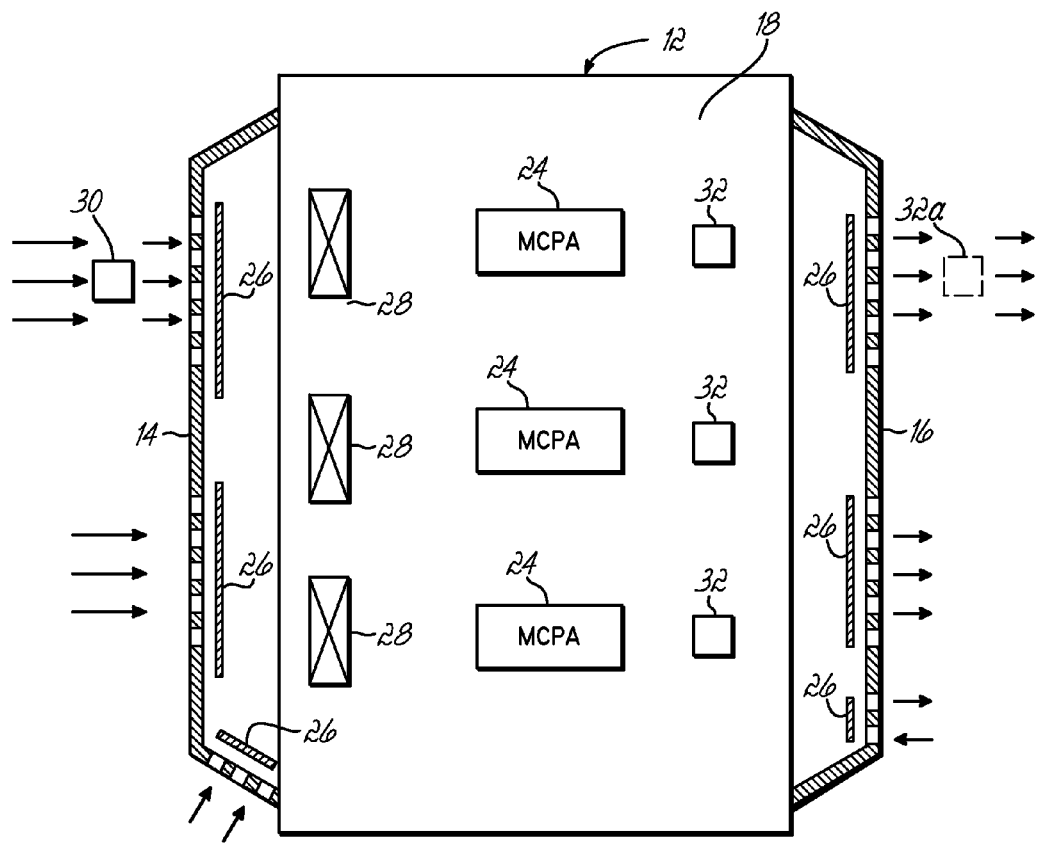
FIG. 2 is a side cross-sectional view of the enclosure of FIG. 1A illustrating the interior space and ventilation system in accordance with the principles of the invention.

Referring to FIGS. 1A and 1B, an enclosure is shown for implementing the present invention. For example, enclosure 10 might be a pressurized outdoor electronics cabinet that contains one or more electronic modules, such as MCPA's, as shown in FIG. 2. The cabinets 10 include a body 12, and a front door or panel 14 and rear door or panel 16 for access into an interior space 18, which houses the electronics. The doors/panels 14, 16 may be open or removed to access the interior space.

Each of the panels includes openings therein for the passage of air into the interior space 18 for the purpose of cooling the electronics 24 therein. The air is drawn into the cabinet through the use of air intake units 28, such as blowers or fans. Generally, the openings, such as a series of perforations or slits, are positioned along the height of the panels. Referring to FIG. 1A, openings 20a are positioned proximate the top of the panel, openings 20b are positioned approximate the center of the panel, and openings 20c are positioned along the bottom of the panel. Similarly, openings 22a, 22b, and 22c might be similarly positioned. In accordance with one aspect of the invention, as discussed below, the rear panel 16 of cabinet 10, has perforated openings 22a at the top and perforated openings 22c along the bottom of the panel. The lower openings allow cool ambient air proximate to the ground to be drawn into the rear of the cabinet by natural convection. This air absorbs heat from the electronics and exits the cabinet through the upper openings 22a, 22b, providing sufficient cabinet ventilation to prevent the electronics from overheating. Therefore, even if clogged air filters or openings prevent forced ventilation by cabinet fans, electronics will continue to operate even at a maximum design ambient of 50° C. FIG. 1B illustrates more clearly the openings 22c in the bottom of the cabinet door 16 for the purposes of natural and convective cooling.

Turning to FIG. 2, a cross-sectional view illustrates the interior space 18 of the cabinet 10, as well as the various electronics, such as MCPA's 24 housed in the interior space. For the purposes of filtering the circulated air proximate the various openings 20a-20c and 22a-22c in the cabinet panels, screens or filters 26 are utilized. Fans 28 are positioned, generally proximate one of the panels 14, 16, to draw ambient air from around the cabinet 10 into the interior space 18, to circulate around the electronics 24. The circulated ambient air is generally cooler than the interior space 18, and thus circulates around the electronics to cool them. The ambient air is thereby heated in the interior space 18, and is exhausted through the openings 22a-22c in the rear panel. Screens or filters 26 might also be utilized over the openings in the rear panel to filter the heated exhausted air as well.

In accordance with one aspect of the invention, a first thermal sensor 30 is positioned proximate an enclosure opening for measuring the ambient temperature of the air pulled or forced into the enclosure. As illustrated in FIG. 2, thermal sensor 30 might be positioned proximate to the inlet openings 20a formed in the front panel 14 for measuring the ambient air temperature of the air surrounding the cabinet that is forced into the cabinet for cooling. Sensor 30 may be any suitable temperature sensor for obtaining that measurement.

One or more second thermal sensors 32 are positioned proximate the air stream exit areas associated with the cooled electronics, such as proximate the exit air streams for the MCPA's, as illustrated in FIG. 2. For example, MCPA's or other electronics might be cooled by passing or blowing air over finned heat sinks of the amplifiers or electronics. Local recirculation zones in the cabinet proximate to the electronics may be much hotter than the air that is actually exiting near the cabinet openings in panel 16. Therefore, positioning the second sensors proximate to the electronics creates a more precise temperature measurement scenario.

Of course, in another embodiment of the invention as illustrated by sensor 32a in FIG. 2, a second sensor might be positioned proximate to one or more of the exit openings 22a-22c in the cabinet to measure the temperature of the air that is actually exiting at those cabinet openings. Therefore, the present invention is not specifically limited to the exact placement of the sensors for measuring the heated exit air stream temperature in accordance with the aspects of the invention.

Thermal sensors 32 measures the temperature of circulated air that has been heated inside the interior space by the electronics. In one embodiment a single sensor 32 might be used in the hottest area of the cabinet. In another embodiment, as illustrated in FIG. 2, multiple sensors would be used proximate to each of the multiple amplifiers or proximate to each shelf of the multiple shelves of electronics in the cabinet. Each sensor then measures the temperature of the exit air in that particular area. For example, there might be a sensor corresponding to each air intake unit 28. In that way, using more than one sensor, an alarm can be initiated or other action taken when a temperature differential in one area of the cabinet or for one amplifier exceeds a setpoint, even though other areas or amplifiers are still properly cooled.

The exhausted or exit air that is measured by the sensors is the result of the pressurized interior space 18, created by the fans 28 drawing air into the cabinet body 12 and around the electronics. If air is flowing properly through the interior cabinet space 18, and the screens or filters 26, and their corresponding openings are not blocked, the exit air streams that are measured by sensors 32 have been heated to a temperature above the ambient air temperature as measured by sensor 30. With proper air movement and ventilation within the cabinet 10, and with a sufficient airflow, the temperature rise between the two sensor measurements or the temperature differential will not be significantly high, or will be in an acceptable range for the cooling aspects of the cabinet and ventilation system. However, if the airflow into the cabinet is blocked, such as through a clogged filter or screen 26 or other blockage, such as a sheet of paper or debris being sucked up against one or more of the inlet openings 20a-20c, fresh ambient air is at least partially blocked from entering the interior space 18. As such, the more stagnant heated air in the interior space 18, such as in the exit air streams for the electronics, is heated further. That is, the rate of airflow through the cabinet is reduced. Consequently, the temperature of the exit air stream measured by one or more sensors 32 increases significantly. As a result, assuming a generally constant ambient temperature, the temperature differential between the temperatures measured by a sensor 32 and by sensor 30 also increases significantly.

Figure 3:
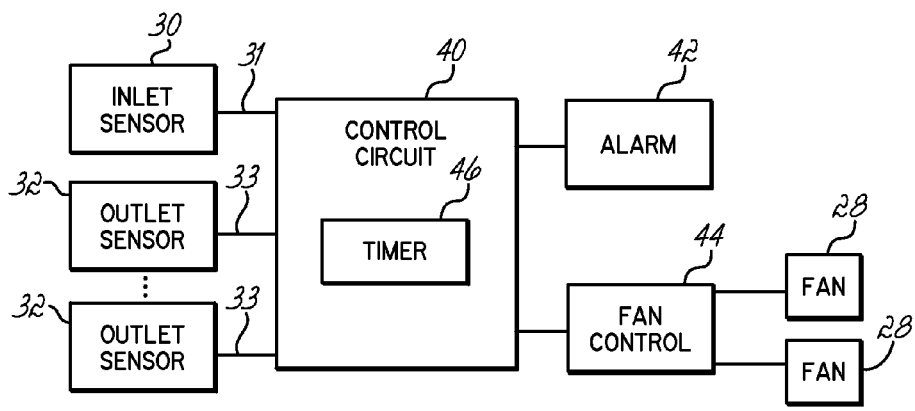
FIG. 3 is a schematic diagram of a ventilation system, with a detection mechanism incorporated therein for monitoring airflow in an enclosure.

The output signals of the inlet ambient air temperature sensor 30 and the one or more exit air stream temperature sensors 32 are coupled to a control circuit 40. The control circuit is configured for receiving output signals on appropriate lines 31, 33, as shown in FIG. 3. The control circuit 40 compares the two temperature outputs and calculates or determines the temperature differential between the measured temperatures from the sensor 30 and the one or more sensors 32. For example, depending on the number of exit air stream sensors, there may be several temperature differentials that are determined by the control circuit 40. When a calculated temperature differential exceeds a control set point, the control circuit initiates an alarm through an alarm device 42 in order to alert an operator about the clogged condition of the openings/filters of the cabinet 10. If the operator is local, the alarm might provide an aural or audible alarm, such a beeper or buzzer or horn, and a visual alarm, such as a light. In an alternative embodiment, the alarm device might include a monitor screen that is positioned remotely from the cabinet 18. Therefore, an operator, or other observer, might perceive the alarm as a visible message on a monitor screen, showing that airflow is restricted in the remote cabinet 10. The operator may then go and unblock the cabinet openings, or provide other air filter maintenance, or may alert additional personnel of the service provider for doing that task in order to prevent overheating of the electronics 24 within the cabinet and a possible shutdown of those electronics.

In one embodiment of the invention, the alarm device 42 may instantly initiate an alarm when the temperature differential first exceeds the control set point. However, in an alternative embodiment of the invention, additional steps might be taken within the inventive system in order to rectify a blocked or clogged condition of the cabinet inlet openings/filters before an actual alarm is initiated. For example, debris, such as a sheet of paper, might be sucked up against one or more of the inlet openings 20a-20c, thus causing the blocked condition and restricted airflow. Control circuit 40 might be coupled to a fan control circuit 44 that operates one or more of the air intake units, such as the fans 28. In response to the temperature differential initially exceeding a set point, the control circuit may take one or more remedial actions prior to initiating an alarm. In one scenario, the control circuit may selectively deactivate one or more of the fans 28 prior to initiating the alarm. After a certain amount of time, the fans might then again be activated or reactivated for cooling purposes to see if the blockage has been removed, and sufficient airflow restored. To that end, control circuit 40 might include a timer 46 for timing the deactivation, and thus, providing subsequent activation or reactivation of the fans. The temperature differential might then again be determined to see if airflow has been increased and proper cooling parameters restored.

In another scenario, the fan control circuit and fans might be operated to spin the fans backwards and thus reverse the direction of the air flow to clear any debris from a blocked opening or unclog a filter. The fans, after a certain amount of time as dictated by the timer 46 might then be restored to the forward direction for proper airflow. In either deactivating or reversing the fans, it may be necessary to cycle the fans several times through deactivation/activation or reverse/forward to restore proper cooling. Thus, the control circuit might be operable to selectively deactivate/activate the fans or change their direction multiple times, prior to initiating an alarm.

In accordance with one aspect of the invention, the control set point might be set in a range that minimizes false alarms, but that still realistically determines a blocked or clogged condition within the ventilation system of the cabinet. In one embodiment, the control set point is in the range of 15°-40° C. That is, when the temperature differential between the temperatures measured by sensor 30 and sensor 32 exceeds 15° C. up to 40° C., the present invention may initiate an alarm and/or take other steps as discussed herein with respect to restoring proper airflow and ventilation/cooling. In a particular embodiment, the set point for the differential temperature might be 30° C. Therefore, normal operation might be indicated by a temperature differential around 0° C. up to 30° C.

In accordance with one aspect of the inventions, the second, thermal sensor 32, might be positioned proximate an area of the cabinet 10 that produces the warmest air temperature. In that way, the present invention may more properly and more immediately address reduced airflow within the interior space 18 of cabinet 10.

The present invention operates regardless of the ambient temperature around a cabinet. For example, in prior systems utilizing only temperature sensors, an increased temperature may be based only upon a rise in the ambient temperature, rather than the restricted airflow within the cabinet. By monitoring the temperature differential, the present invention will operate at any ambient temperature, and will initiate an alarm only when the end temperature of the exhaust air is significantly above the beginning temperature of the ambient air forced into the cabinet. Since the alarm does not depend on a high ambient temperature, blockage or clogging can be detected at any ambient temperature in any season of the year.

In accordance with another aspect of the invention, the ventilation system prevents equipment thermal shutdown, even in the event of restricted airflow. To that end, as illustrated in FIGS. 1A, 1B, and 2, the rear panel of door 16 of the cabinet has openings, perforations, or screens 22c at the bottom of the cabinet and also such openings 22a at the top of the cabinet. The lower openings 22c allow cool ambient air to be drawn into the rear of the cabinet by natural convection. This air absorbs heat from the electronics and exits the cabinet through the upper screens, thus providing sufficient cabinet ventilation to prevent the electronics from overheating. Therefore, even if the clogged air filters prevent forced ventilation by the cabinet fans, the electronics will continue to operate even at a maximum design ambient of 50° C.

In that way, the present invention reduces overheated electronic modules by addressing clogged or blocked openings or air filters, such as within a pressurized outdoor electronics cabinet. The present invention reduces electronic module shutdown, and thus, reduces those incidences of loss of service to wireless phone subscribers. Furthermore, the invention provides alternatives for rectifying the blockage issue prior to initiating an alarm, thus, saving a service provider valuable time and costs if the cause of a blockage is debris drawn against the inlet openings that will readily fall away when the fans cease. The cabinet ventilation system prevents equipment thermal shutdown, even in the event of restricted airflow by allowing cool ambient air to be drawn into the lower screens, located in the rear of the cabinet by natural convection. This air absorbs heat from the electronics and exits the cabinet through the upper screens, thus providing sufficient cabinet ventilation to prevent the electronics from overheating. The present invention provides other benefits and advantages in addition to those discussed specifically herein.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details of representative apparatus and method, and illustrative examples shown and described. Accordingly, departures may be made from such details without departure from the spirit or scope of applicant's general inventive concept.

What is claimed is:

1. A detection mechanism for monitoring airflow in an enclosure that has an interior space housing electronics cooled with forced ambient air and at least one air intake unit for forcing air through the interior space, the detection mechanism comprising:

a first thermal sensor positioned proximate the enclosure for measuring an ambient air temperature;

a second thermal sensor positioned proximate an exit air stream of the enclosure for measuring the temperature of air that is heated in the enclosure;

a control circuit coupled with the first and second thermal sensors and configured for receiving output signals from the thermal sensors and determining a temperature differential between the measured temperatures of the thermal sensors;

the control circuit includes a timer and is further coupled with the air intake unit and operable to selectively temporarily deactivate or reverse the direction of the air intake unit when the temperature differential exceeds the setpoint;

the control circuit further operable for initiating an alarm when the temperature differential exceeds a setpoint thereby indicating restricted airflow in the enclosure.

2. The detection mechanism of claim 1 further comprising an alarm device, wherein the alarm device is configured for providing an alarm that includes at least one of an aural and a visual indication to alert an observer of restricted airflow.

3. The detection mechanism of claim 1 further comprising an alarm device, wherein the alarm device is configured for providing an alarm that is visible at a monitor screen to alert an observer of restricted airflow.

4. The detection mechanism of claim 1 wherein the exit air stream is positioned in the interior space proximate to the electronics therein.

5. The detection mechanism of claim 1 wherein the exit air stream is positioned proximate to an outlet opening of the enclosure for measuring the temperature of air that is exiting the enclosure.

6. The detection mechanism of claim 1 wherein the control circuit selectively deactivates or reverses the direction of the air intake unit prior to initiating an alarm.

7. The detection mechanism of claim 1 wherein the control circuit selectively deactivates or reverses the direction of the air intake unit for a selected time and then activates or restores the forward direction of flow of the air intake unit.

8. The detection mechanism of claim 7 wherein the control circuit selectively deactivates/activates or reverses/restores the forward direction of the flow of the air intake unit multiple times prior to initiating an alarm.

9. The detection mechanism of claim 1 wherein the setpoint is in the range of 15° to 40° C.

10. The detection mechanism of claim 1 wherein the second thermal sensor is positioned proximate an exit air stream of the enclosure that produces the warmest air temperature.

11. A ventilation system for cooling an interior space of an enclosure having an inlet opening and an outlet opening, the ventilation system comprising:

at least one air intake unit positioned proximate the inlet opening in the enclosure for forcing ambient air through the enclosure and out the outlet opening;

a first thermal sensor positioned proximate the enclosure inlet opening for measuring the ambient air temperature;

a second thermal sensor positioned proximate an exit air stream of the enclosure for measuring the temperature of air that is heated in the enclosure;

a control circuit coupled with the first and second thermal sensors and configured for receiving output signals from the thermal sensors and determining a temperature differential between the measured temperatures of the thermal sensors;

the control circuit includes a timer and is further coupled with the air intake unit and operable to selectively temporarily deactivate or reverse the direction of the air intake unit when the temperature differential exceeds the setpoint;

the control circuit operable for initiating an alarm from the alarm device when the temperature differential exceeds a setpoint thereby indicating restricted airflow in the enclosure.

12. The ventilation system of claim 11 further comprising an alarm device, wherein the alarm device is configured for providing an alarm that includes at least one of an aural and a visual indication to alert an observer of restricted airflow.

13. The ventilation system of claim 11 further comprising an alarm device, wherein the alarm device is configured for providing an alarm that is visible at a monitor screen to alert an observer of restricted airflow.

14. The ventilation system of claim 11 wherein the exit air stream is positioned in the interior space proximate to the electronics therein.

15. The ventilation system of claim 11 wherein the exit air stream is positioned proximate to the outlet opening of the enclosure for measuring the temperature of air that is exiting the enclosure.

16. The ventilation system of claim 11 wherein the control circuit selectively deactivates or reverses the direction of the air intake unit prior to initiating an alarm.

17. The ventilation system of claim 11 wherein the control circuit selectively deactivates or reverses the direction of the air intake unit for a selected time and then activates or restores the forward direction of flow of the air intake unit.

18. The ventilation system of claim 17 wherein the control circuit selectively deactivates/activates or reverses/restores the forward direction of the flow of the air intake unit multiple times prior to initiating an alarm.

19. The ventilation system of claim 11 wherein the setpoint is in the range of 15°0 to 40° C.

20. An enclosure for housing electronics comprising;

a cabinet having an interior space and inlet openings into the space and outlet openings from the space;

at least one air intake unit positioned proximate the inlet openings in the cabinet for forcing ambient air through the interior space and out the outlet openings for cooling electronics in the cabinet;

a first thermal sensor positioned proximate the inlet openings for measuring the air ambient temperature;

a second thermal sensor positioned proximate an exit air stream of the cabinet for measuring the temperature of air that is heated in the cabinet;

a control circuit coupled with the first and second thermal sensors and configured for receiving output signals from the thermal sensors and determining a temperature differential between the measured temperatures of the thermal sensors;

the control circuit includes a timer and is further coupled with the air intake unit and operable to selectively temporarily deactivate or reverse the direction of the air intake unit when the temperature differential exceeds the setpoint;

the control circuit operable for initiating an alarm when the temperature differential exceeds a setpoint thereby indicating restricted airflow through the cabinet.

21. The enclosure of claim 20 further comprising a screen over at least an inlet opening or an outlet opening of the cabinet.

22. The enclosure of claim 20 wherein the inlet openings are located on one side of the cabinet and the outlet openings are located on an opposite side of the cabinet.

23. The enclosure of claim 20 wherein the inlet openings include multiple inlet openings that are positioned in spaced apart relation on the one side of the cabinet, and further comprising multiple air intake units positioned proximate to respective inlet openings to force air through the interior space.

24. The enclosure of claim 20 wherein the outlet openings include multiple outlet openings that are positioned in spaced apart relation on the opposite side of the cabinet, a first outlet opening positioned proximate a top of the cabinet and a second outlet opening positioned proximate a bottom of the cabinet for convectively passing air through the interior space to cool electronics in the cabinet.

25. The enclosure of claim 20 wherein the exit air stream is positioned in the interior space proximate to the electronics therein.

26. The enclosure of 20 wherein the exit air stream is positioned proximate to an outlet opening of the cabinet for measuring the temperature of air that is exiting the cabinet.

27. The enclosure of claim 20 further comprising an alarm device, wherein the alarm device is configured for providing an alarm that includes at least one of an aural and a visual indication to alert an observer of restricted airflow.

28. The enclosure of claim 20 further comprising an alarm device, wherein the alarm device is configured for providing an alarm that is visible at a monitor screen to alert an observer of restricted airflow.

29. The enclosure of claim 20 wherein the control circuit selectively deactivates or reverses the direction of the air intake unit prior to initiating an alarm.

30. The enclosure of claim 20 wherein the control circuit selectively deactivates or reverses the direction of the air intake unit for a selected time and then activates or restores the forward direction of flow of the air intake unit.

31. The enclosure of claim 30 wherein the control circuit selectively deactivates/activates or reverses/restores the forward direction of the flow of the air intake unit multiple times prior to initiating an alarm.

32. The enclosure of claim 20 wherein the setpoint is in the range of 15° to 40° C.

* * * * *